United States Patent
Weinert et al.

(10) Patent No.: US 9,103,048 B2
(45) Date of Patent: Aug. 11, 2015

(54) DEVICE AND PROCESS FOR PRODUCING POLY-CRYSTALLINE OR MULTI-CRYSTALLINE SILICON; INGOT AS WELL AS WAFER OF POLY-CRYSTALLINE OR MULTI-CRYSTALLINE SILICON PRODUCED THEREBY, AND USE FOR THE MANUFACTURE OF SOLAR CELLS

(75) Inventors: Berndt Weinert, Freiberg (DE); Manfred Jurisch, Dresden (DE); Stefan Eichler, Dresden (DE)

(73) Assignee: FRIEBERGER COMPOUND MATERIALS GMBH, Freiberg (DE)

( * ) Notice: Subject to any disclaimer, the term of this patent is extended or adjusted under 35 U.S.C. 154(b) by 771 days.

(21) Appl. No.: 12/597,347

(22) PCT Filed: Dec. 21, 2007

(86) PCT No.: PCT/EP2007/011378
§ 371 (c)(1),
(2), (4) Date: Oct. 23, 2009

(87) PCT Pub. No.: WO2008/131794
PCT Pub. Date: Nov. 6, 2008

(65) Prior Publication Data
US 2010/0127221 A1    May 27, 2010

(30) Foreign Application Priority Data
Apr. 27, 2007  (DE) .......................... 10 2007 020 006

(51) Int. Cl.
*C01B 33/02*   (2006.01)
*B22D 27/00*   (2006.01)
(Continued)

(52) U.S. Cl.
CPC ................ *C30B 11/00* (2013.01); *C30B 29/06* (2013.01); *H01L 31/182* (2013.01); *Y02E 10/546* (2013.01)

(58) Field of Classification Search
None
See application file for complete search history.

(56) References Cited

U.S. PATENT DOCUMENTS 5,431,869 A * 7/1995 Kumar et al. .................. 264/85
6,013,872 A   1/2000 Woditsch et al.
(Continued)

FOREIGN PATENT DOCUMENTS

DE    198 10 019 A1    10/1998
DE    100 56 726 A1     5/2002
(Continued)

OTHER PUBLICATIONS

D. Helmreich et al., "Progress in Ingot and Foil Casting of Silicon", Journal of Crystal Growth, vol. 79, No. 1-3, 1986, pp. 562-571.
(Continued)

*Primary Examiner* — Melvin C Mayes
*Assistant Examiner* — Michael Forrest
(74) *Attorney, Agent, or Firm* — Foley & Lardner LLP

(57) ABSTRACT

A process and a device for producing crystalline silicon, particularly poly- or multi-crystalline silicon are described, wherein a melt of a silicon starting material is formed and the silicon melt is subsequently solidified in a directed orientation. A phase or a material is provided in gaseous, fluid or solid form above the melt in such a manner, that a concentration of a foreign atom selected from oxygen, carbon and nitrogen in the silicon melt and thus in the solidified crystalline silicon is controllable, and/or that a partial pressure of a gaseous component in a gas phase above the silicon melt is adjustable and/or controllable, the gaseous component being selected from oxygen gas, carbon gas and nitrogen gas and gaseous species containing at least one element selected from oxygen, carbon and nitrogen. The formation of impurity compound precipitations or inclusions, in particular of silicon carbide affecting electric properties of solar cells, can be effectively inhibited and prevented according to the present invention.

28 Claims, 3 Drawing Sheets

(51) Int. Cl.
*C30B 11/00* (2006.01)
*C30B 29/06* (2006.01)
*H01L 31/18* (2006.01)

(56) References Cited

U.S. PATENT DOCUMENTS

| | | |
|---|---|---|
| 6,299,682 B1 | 10/2001 | Wakita et al. |
| 6,368,403 B1 * | 4/2002 | Schmid et al. .................. 117/79 |
| 6,378,835 B1 | 4/2002 | Wakita et al. |
| 6,383,285 B1 | 5/2002 | Wakita et al. |
| 6,540,828 B2 | 4/2003 | Wakita et al. |
| 6,576,831 B2 | 6/2003 | Woditsch et al. |
| 2002/0078992 A1 | 6/2002 | Woditsch et al. |
| 2002/0112658 A1 | 8/2002 | Holder et al. |
| 2002/0139297 A1 * | 10/2002 | Wakita et al. ................. 117/206 |
| 2008/0203361 A1 * | 8/2008 | Dutta .......................... 252/518.1 |
| 2008/0295294 A1 * | 12/2008 | Skelton et al. ............. 23/295 R |
| 2009/0266396 A1 | 10/2009 | Niira et al. |

FOREIGN PATENT DOCUMENTS

| | | |
|---|---|---|
| DE | 10 2006 017 622 A1 | 10/2007 |
| EP | 0 939 146 B1 | 9/1999 |
| JP | 11-310496 A | 11/1999 |
| JP | 2000-001308 | 1/2000 |
| JP | 2001-010810 A | 1/2001 |
| JP | 2002-293691 A | 10/2002 |
| JP | 2007-045662 A | 2/2007 |
| WO | WO 2006/093099 A1 | 9/2006 |
| WO | WO 2006/104107 A1 | 10/2006 |

OTHER PUBLICATIONS

P.S. Ravishankar, "Liquid Encapsulated Bridgman (LEB) Method for Directional Solidification of Silicon Using Calcium Chloride", Journal of Crystal Growth, vol. 94, No. 1, 1989, pp. 62-68.

C. Reimann et al., at the Annual Meeting of the German Society for Crystal Growth (DGKK) held from Mar. 7 to 9, 2007, Bremen, report about an analysis of the formation conditions of SiC- and Si3N4-precipitates in the directed solidification of multi crystalline silicon for solar cells.

* cited by examiner

DEVICE AND PROCESS FOR PRODUCING POLY-CRYSTALLINE OR MULTI-CRYSTALLINE SILICON; INGOT AS WELL AS WAFER OF POLY-CRYSTALLINE OR MULTI-CRYSTALLINE SILICON PRODUCED THEREBY, AND USE FOR THE MANUFACTURE OF SOLAR CELLS

The present invention relates to a device as well as a process for producing crystalline silicon, in particular poly- or multi-crystalline silicon, by directed solidification, to an ingot (bulk crystal) produced thereby and silicon wafers obtained by separating the ingot, as well as use of the silicon wafers for the manufacture of solar cells.

Directed (or oriented) solidification of a silicon starting material for producing poly-crystalline or multi-crystalline silicon for use in photovoltaics or for manufacturing solar cells is known and becomes more and more important, in view of the demand for producing solar cells at low costs compared to other more expensive and complex manufacturing techniques. A particular problem in the production of poly- or multi-crystalline silicon by directed solidification is the formation of foreign precipitates or inclusions for foreign matter in the obtained ingot of the crystalline silicon. Such precipitates or inclusions form interfering impurities in the silicon wafer produced from the ingot, and correspondingly in the subsequently produced solar cell. In particular electrically active precipitates of silicon carbide (SiC) are interfering, which transforms, for example, to a local heating by short circuits in the regions of the precipitates in the finally used device. Precipitates or inclusions based on nitrides, such as $Si_3N_4$, or based on oxides having respectively different compositions, are undesirable, too. In total, the efficiency and the performance of the produced solar cell may be affected.

DE 100 56 726 A (corresponding to US 2002/0078992 A1) in the introductory part briefly touches upon the problem of inclusions like silicon carbide (SiC). However, the proper teaching of this document exclusively deals with the problem of crystal defects, which are caused by electrically active grain boundaries, and its solution.

Document DE 198 10 019 A1 addresses the problem of undesirable, but inevitable impurities such as oxygen or carbon, respectively introduced by the procedural technology (for example oxygen derived from a quartz crucible, or carbon derived from graphite components of the crystallization apparatus). As an alternative to expensive, highly purified starting materials, the DE 198 10 019 A1 proposes to previously add to the starting material impurities of arsenic and/or antimony by purpose, in order to obtain solar cell efficiencies which are equivalent to a multi-crystalline silicon sample using a highly pure silicon starting material.

DE 10 2006 017 622 A1 published on Oct. 18, 2007 describes a device and a process for producing multi-crystalline silicon by directed solidification, wherein a cover is placed on a crucible containing the molten liquid silicon to leave an inner space, and wherein a flushing gas inlet and a flushing gas outlet are provided in order to flush the inner space above the silicon melt. The flushing gas shall be free of carbon oxide, preferably using argon gas, in order to create an atmosphere in the inner space free of carbon oxide and to flush away gases and steam. In this manner, an attempt is made to avoid the formation of SiC in the melt.

However, presence or generation of carbon within the silicon melt may not only derive from an atmosphere above the silicon melt, but is readily incorporated inevitably from starting materials for forming the silicon melt as well as possibly from components of the furnace or other parts of the whole apparatus. In the system as prescribed by DE 10 2006 017 622 A, an equilibrium state of gaseous species above the silicon melt cannot be accomplished.

C. Reimann et al., at the Annual Meeting of the German Society for Crystal Growth (DGKK) held from Mar. 7 to 9, 2007, Bremen, report about an analysis of the formation conditions of SiC— and $Si_3N_4$-precipitates in the directed solidification of multi crystalline silicon for solar cells. It is shown that formation of SiC-precipitates occurs from a critical concentration of Cs (C in Si-lattice). An interstitial oxygen distribution represents the form of the phase boundary interface. In an attempt for explaining the observed Cs-distribution, a correlation with convection patterns is made. However, even if an influence or change of the convection as a solution for avoiding precipitates was contemplated, this would not be readily possible either technically or in a controlled manner. Furthermore, it is questionable whether such a change of the convection would indeed lead to avoiding precipitates of e.g. SiN-compounds and/or SiC.

Therefore, an object of the present invention is to provide a process and a device, by which precipitates or inclusions of foreign matter can be eliminated or avoided in the directed solidification of crystalline, in particular of poly- or multi-crystalline silicon, and to provide corresponding ingots as well as wafers obtained therefrom, made of poly- or multi-crystalline silicon, which wafers are suitable for the manufacture of solar cells.

According to the present invention, there is provided a process for producing crystalline silicon, comprising the steps:

forming a melt of a silicon starting material,
performing directed solidification of the silicon melt, wherein
a) a phase on a material in gaseous, fluid or solid form is provided above the melt such, that a concentration of a foreign atom selected from the group consisting of oxygen, carbon and nitrogen in the silicon melt and thus in the solidified crystalline silicon is controlled; and/or
b) a partial pressure of a gaseous component in a gas phase above the silicon melt is adjusted and/or controlled, the gaseous component being selected from the group consisting of oxygen gas, carbon gas and nitrogen gas and gaseous species containing at least one element selected from oxygen, carbon and nitrogen.

According to a further embodiment of the present invention, there is also provided a process for producing crystalline silicon, comprising the steps:

forming a melt from a silicon starting material,
performing directed solidification of the silicon melt,
a) wherein the silicon starting material is melted in a crucible under a condition, wherein a covering material laying above the silicon melt is provided; and/or
b) wherein the crucible is provided in a manner, that a limited gas space providing a controlled gas atmosphere separated to the outside is formed above the silicon melt.

The present invention further provides an apparatus or device for producing crystalline silicon, comprising:

a crucible (5), chargeable by a silicon starting material,
at least one heater (6, 7) for heating the crucible, wherein the device is arranged such that
a) a concentration of a foreign atom selected from oxygen, carbon and nitrogen within the silicon melt (1) and thus within the solidified crystalline silicon (2) is controllable; and/or
b) a partial pressure of a gaseous component in a gas phase arranged above the silicon melt is adjustable and/or controllable, the gaseous component being selected from the group consisting of oxygen gas, carbon gas and nitrogen gas and gaseous species containing at least one element selected from oxygen, carbon and nitrogen.

The present invention further provides an ingot formed of crystalline silicon through directed solidification of a silicon starting material, wherein the ingot comprises no or essentially no foreign precipitations or inclusions of silicon carbide (SiC) and/or silicon nitride (SiN, $Si_3N_4$).

Furthermore, the present invention provides a silicon wafer made of crystalline silicon, in particular of poly-crystalline or multi-crystalline silicon, obtained by separation or individualization from the aforementioned ingot. The silicon wafer according to the present invention is preferably used for the manufacture of a solar cell.

The principle, further advantages and preferred features of the present invention will be illustratively explained in the following.

The concept according to the present invention for avoiding precipitations or inclusions of foreign matter, e.g. nitrides such as generally $Si_xN_y$ (wherein x and y, independently from each other, respectively denote integers ranging e.g. from 1 to 6) or specifically $Si_3N_4$, carbides such as SiC and oxides such as SiO and/or $SiO_2$, is based on thermo-chemical or thermo-dynamic considerations. With the term "foreign matter", impurities and especially foreign compounds different from pure silicon is meant. Measures are undertaken or conditions are created such that the formation of precipitations or inclusions are thermo-chemically or thermo-dynamically not favoured, or are even completely suppressed. As an effective possibility according to one embodiment, partial pressures of gaseous components containing oxygen (including oxygen-containing gases), carbon (including carbon-containing gases such as carbon oxide gases) and/or nitrogen (including nitrogen-containing gases such as nitrogen oxide gases) existing above the silicon melt, is (are) adjusted. As a further effective possibility, a concentration of a foreign atom selected from oxygen, carbon and/or nitrogen within the silicon melt and thus within the solidified poly- or multi-crystalline silicon is controlled. An effective aim consists in that an oxygen concentration within the melt is caused not to decrease below a critical value or level as long as possible and preferably during the whole period of performing the directed solidification step. A concentration of $C_s$ (C within the Si-lattice), which is found to be anti-correlated with the oxygen concentration, is compensated in its deleterious effect, or higher values or levels of $C_s$ within the melt and then in the solid Si can be tolerated. Provided that proper conditions are set according to the present invitation, a suitable oxygen concentration within the melt and consequently within the solidified silicon (Si) protects thermo-chemically against formation of inclusions or precipitates of foreign matter and in particular against the formation of highly critical carbide (SiC). Analogous thermo-chemical concentrations apply for the formation or avoidance of nitrides.

Without the intention of being bound to any theory, the following can be assumed as causative factors for the precipitation or inclusion of foreign matter, which causative factors however are counter-acted by the present invention. With a directed solidification system, often heaters and other components made of graphite is used, and/or oxygen and carbon are introduced into the system through residual water or moisture at the beginning of the process or from the starting material (in turn through residual water or moisture or by oxidation layers). Eventually, CO may be formed from these species within the Si-melt or above it in the gas space, and elementary carbon (C) is present within the Si-melt. The additional CO further reacts with the Si-melt to form additional C and SiO. If the measures and conditions according to the present invention are not observed, remaining elementary carbon (C) is dissolved within the Si-melt. Furthermore, SiO may condensate at relatively cold locations such as, e.g., a cold wall of the production apparatus, or it may disproportionate into $SiO_2$ and Si. On the other hand, the $SiO_2$-crucible is subject to being dissolved by the Si-melt under the formation of SiO, which primarily transforms into a certain oxygen concentration in the melt and eventually expresses itself as oxygen being present on interstitial lattice sites or, at higher concentrations, at the grain boundaries/interfaces.

From the thermo-chemical point of view, the formation of solid precipitations or inclusions, such as SiC and $Si_3N_4$, in the Si-melt is favoured when the dissolved oxygen concentration drops below a critical value or level. Furthermore, nitrides such as $Si_3N_4$-particles may be stripped-off from a nitride-coating of the crucible.

As the generation of coke, i.e. a continued increase of carbon concentration in the Si-melt, and a decrease of an oxygen concentration in the melt are kinetically inhibited processes, the system tends to cause no precipitates or inclusions at the beginning of the process. But in the course of the solidification process, especially at a certain point of time when the oxygen concentration drops below a critical value or level relative to a corresponding C-concentration present at that point of time, the formation of SiC-particles in the melt starts. At another point of time, when the oxygen concentration adopts quite low values or levels, the formation of nitrides such $Si_3N_4$-particles is favoured, involving nitrogen being physically dissolved within the melt. Here, it is to be noted that while the formation of SiC may occur first and the formation of $Si_3N_4$-particles thereafter, this may occur also vice versa. At what time of the solidification process and in which order the formation of foreign matter occurs primary depends on temperature, the pressure and actual concentrations of O, N and C within the Si-melt. By the convection of the melt, the formed foreign matter is driven with the chosen solidification rate in front of the phase boundary/interface and will be concentrated in the centre. When the phase boundary interface reaches this region, precipitates or inclusions are incorporated in substantial amounts as particulate foreign matter within the solidified silicon material.

According to the present invention, the following preferred embodiments, respectively alone or in combination, are contemplated as possible and particularly effective technical means and conditions:

For example, the molten silicon starting material is solidified in a covered crucible being essentially separated to the outside, preferably being hermetically sealed, with the optional exception that an inlet for delivering inert carrier gas (for example argon) or an inlet for delivering oxygen-, carbon- and/or nitrogen-containing gaseous species (for example CO, $CO_2$, NO or $NO_2$) into a gas space above the silicon melt are respectively provided for establishing an equilibrium gas atmosphere in the crucible. Preferably, the crucible is designed in a manner that a limited, closed gas space is provided above the silicon melt. This is realized in a technically particularly effective, yet an easy manner such by sealing the crucible via a cover or a plate. The cover or a plate preferably is made of by temperature-resistant graphite or temperature-resistant ceramic. In this manner, all components of a furnace surrounding the silicon melt can be brought to and/or maintained at a temperature during the phase of the solidification of the silicon lying above condensation temperatures of oxide species such as silicon oxide (in particular silicon monoxide and possibly also silicon dioxide). By the aforementioned measures and conditions, a relatively gastight vessel with hot walls surrounding the silicon melt is formed, where SiO can not condensate or disproportionate at the walls, or where CO possibly formed at the furnace wall can not react with the silicon melt.

Furthermore, the partial pressures of critical gases affecting the thermo-chemical and thermo-dynamic processes as explained above are favourably influenced such that the formation of foreign matter such as compound precipitates is minimized or eliminated. As mentioned, a possible further option is to deliver an inert gas and/or gaseous species containing oxygen, carbon and/or nitrogen in a controlled manner into the gas space above the silicon melt via appropriate sources, pipes and valves in order to adjust an equilibrium gas atmosphere that finally inhibits and prevents compound precipitates.

Alternatively or in addition, a cover material overlaying the silicon melt, preferably a powdery, a granular or a molten cover material may be used. The cover material is preferably selected from the group consisting of pure oxides or pure carbonides of elements of the III. and IV. main group of the periodic table of elements, or mixtures thereof. Examples of suitable cover materials include silicon dioxide, germanium dioxide, aluminum oxide, boron oxide, or a mixture of the aforementioned oxides. Covering the melt advantageously further contributes to avoiding condensation areas. Furthermore, formed CO can be continuously withdrawn from the silicon melt. Using an appropriate cover material may contribute to a further advantageous effect, namely by using a cover material overlaying the silicon melt and containing a dopant compound, such as, e.g., boron oxide, aluminum oxide and/or germanium oxide. The cover material may simply be applied by distributing a powder, pellets or particles on the silicon starting material.

According to a specific embodiment, at least during the solidification phase and advantageously also during the heating-up and/or during the melting process, a chemically inert gas is enclosed within the defined space above the silicon melt and optionally the silicon starting material, preferably in a manner that the chemically inert gas in a heated status represents the only or essentially the only carrier gas in the space separated from the outside. The inert gas then can contribute to controlling and maintaining partial pressures of the aforementioned gaseous species within the gas phase above the silicon for inhibiting the formation of foreign matter. Furthermore, a gas space filled at a steady-state equilibrium exclusively or almost only by the chemically inert gas above the silicon melt additionally contributes to the effect that any reaction with a hot or cold wall of the surrounding system can be prevented, and that consequently the Si-melt is not contaminated. Here, steady-state equilibrium means allowing a controlled gas atmosphere, distinguished from an uncontrolled flush gas stream. Preferably, the chemically inert gas is argon.

Another preferred measure is to control and/or reduce residual water or moisture content, and/or to control and/or reduce oxide impurities from starting materials and/or from components of the production device communicating with the silicon melt during the production process. In this manner, residual water or moisture content can be reduced by using a silicon starting material, whose water content had been reduced, or by extracting residual moisture by suction out of the space surrounding the silicon material before crystallization by solidification is started. Therefore, it may preferably be sufficient to seal, or to separate the space surrounding the silicon melt from the outside just for the solidification phase.

Thus, the measures and conditions described above respectively contribute, alone or in combination, to the effect that the formation of precipitates or inclusions can be effectively prevented. The present invention allows to surely prevent the formation of foreign matter, in particular that of SiC-precipitates or -inclusions, in spite of a certain CO-concentration in the gas phase and/or a C-concentration in the Si-melt. In particular, controlling the oxygen content in the silicon melt can compensate an anti-correlated presence of carbon in the melt. The $Si_xN_y$ of formation (e.g. $Si_3N_4$) should be surely prevented also, because in the presence of a controlled amount of oxygen a nitride compound is practically not existent, or is present at most at a negligible level.

Thereby, it is possible according to the present invention to provide an ingot based on crystalline silicon, in particular mono-crystalline and more preferably poly-crystalline or multi-crystalline silicon, which has been obtained by directed solidification of a silicon starting material and which contains no or essentially no foreign precipitations or inclusions of silicon carbide (SiC) and/or silicon nitride (SiN, $Si_3N_4$, etc.). Here, "essentially no foreign precipitations or inclusions" means that no short circuits occur during normal operational use of the wafer or the solar cell obtained according to the present invention. In terms of structural analysis, it means that, when a 0.5 g sample of the obtained crystalline silicon is dissolved in a 20 ml mixture of HF (38% in water) and $HNO_3$ (65% in water), at maximum foreign precipitations or inclusions with mean particle diameters below 10 μm, more preferably below 1 μm remain. Owing to the technical measures and conditions described above, an ingot can be realized according to the present invention with the feature that the oxygen concentration does not drop below a critical limit "essentially" in the whole ingot, where "essentially" means in relation to ingot sections ranging in the majority from the bottom to the head of a solidified ingot or at least up to almost the tip of a head, e.g. up to 90%, preferably up to 95% and even up to 98% of the height of the whole ingot. At the same time, precipitation or inclusion of $SiO_x$ at the grain boundaries/interfaces can be avoided. The level of the limit, below which the oxygen concentration shall not fall, also depends on the carbon concentration $C_s$, which should be observed at the same time, because both values relate to each other in an anti-correlation. As a rule, for surely preventing precipitations and inclusions, the oxygen concentration should not drop below a limit about $3.5 \times 10^{17}$ $cm^{-3}$, preferably combined with a maximum carbon concentration of at most about $1 \times 10^{18}$ $cm^{-3}$, wherein the concentrations are respectively defined relative to a correspondingly solidified ingot section (i.e. corresponding values of O and C respectively measured at the same ingot section). In order to further prevent precipitations or inclusions of oxides or other impurities, the oxygen concentration in at least 90% of the height and preferably in the whole ingot should, on the other hand, lie preferably below about $1 \times 10^{19}$ $cm^{-3}$, more preferably below about $1 \times 10^{18}$ $cm^{-3}$. With respect to the carbon concentration, it is moreover sufficient, if it lies below a limit of about $6 \times 10^{17}$ $cm^{-3}$. The mentioned values refer to respectively solidified ingot sections obtained from the process described above, i.e. sections that are usable for the recovery of silicon wafers and subsequently for the manufacture of solar cells.

The desired silicon wafers made of crystalline, in particular mono-crystalline and preferably poly- or multi-crystalline silicon, may then be obtained from the ingots described above by separation or individualization. A suitable separation process is by sawing. The invention offers the highly valuable advantage that, on the one hand, usable silicon wafers can be recovered from a larger region of the ingot, which significantly counteracts material loss. On the other hand, the invention ensures that all usable wafers recovered from a single ingot are defect-free. Physical properties and performance of the obtained wafers as well as system economy as a whole are significantly improved according to the present invention.

The thus obtained wafers of crystalline, in particular monocrystalline and preferably poly- or multi-crystalline silicon, are therefore particularly suitable for the manufacture of solar cells. The steps required for the manufacture of solar cells are well-known to the person skilled in the art. Thus, there are, for example, formed p/n-junctions, metal/isolator/semiconductor-junctions, metal/semiconductor-junctions or similar or other features or elements of usual solar cell devices. Furthermore, epitaxial layers may be deposited and devices other than solar cells can be beneficially manufactured. Moreover, dopants may be incorporated into the silicon crystal, for example including at least one element of group III and/or at least one element of group V of the periodic table of elements, such as, e.g., B, P, Al, Ga and/or In.

In the following, the invention will be explained in more detail by reference to the attached drawings, wherein, however, the drawings, embodiments and examples merely serve for illustration of the invention, but shall not be interpreted in any limitive manner.

Figure 3:
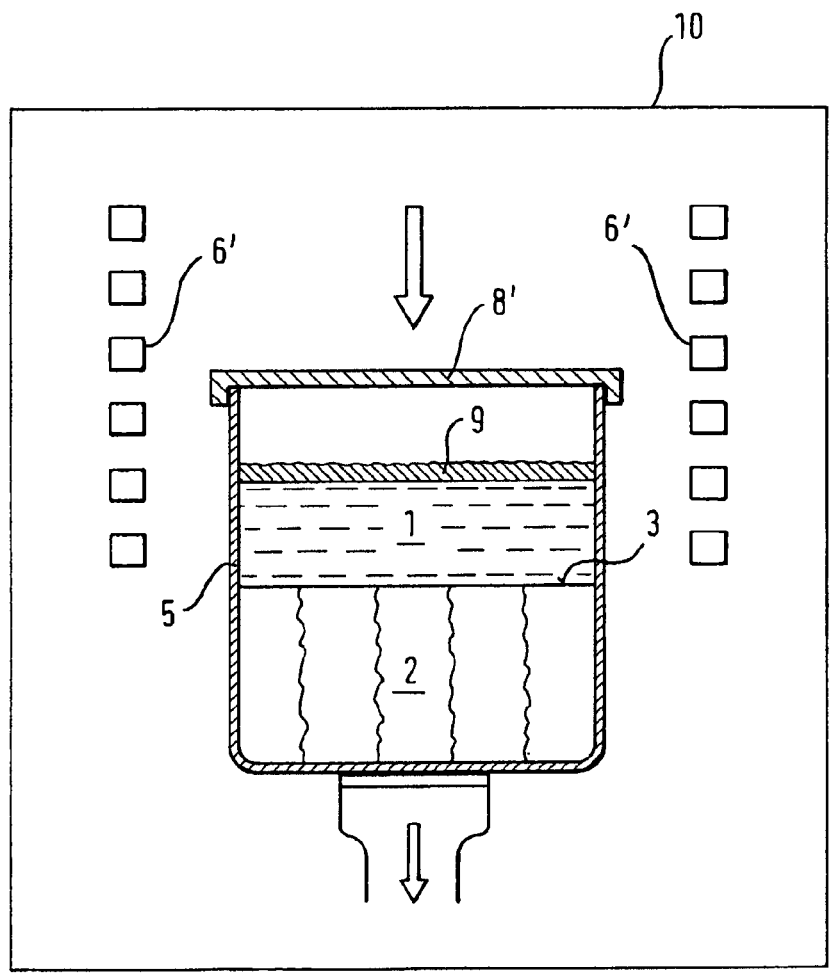
Figure 4:
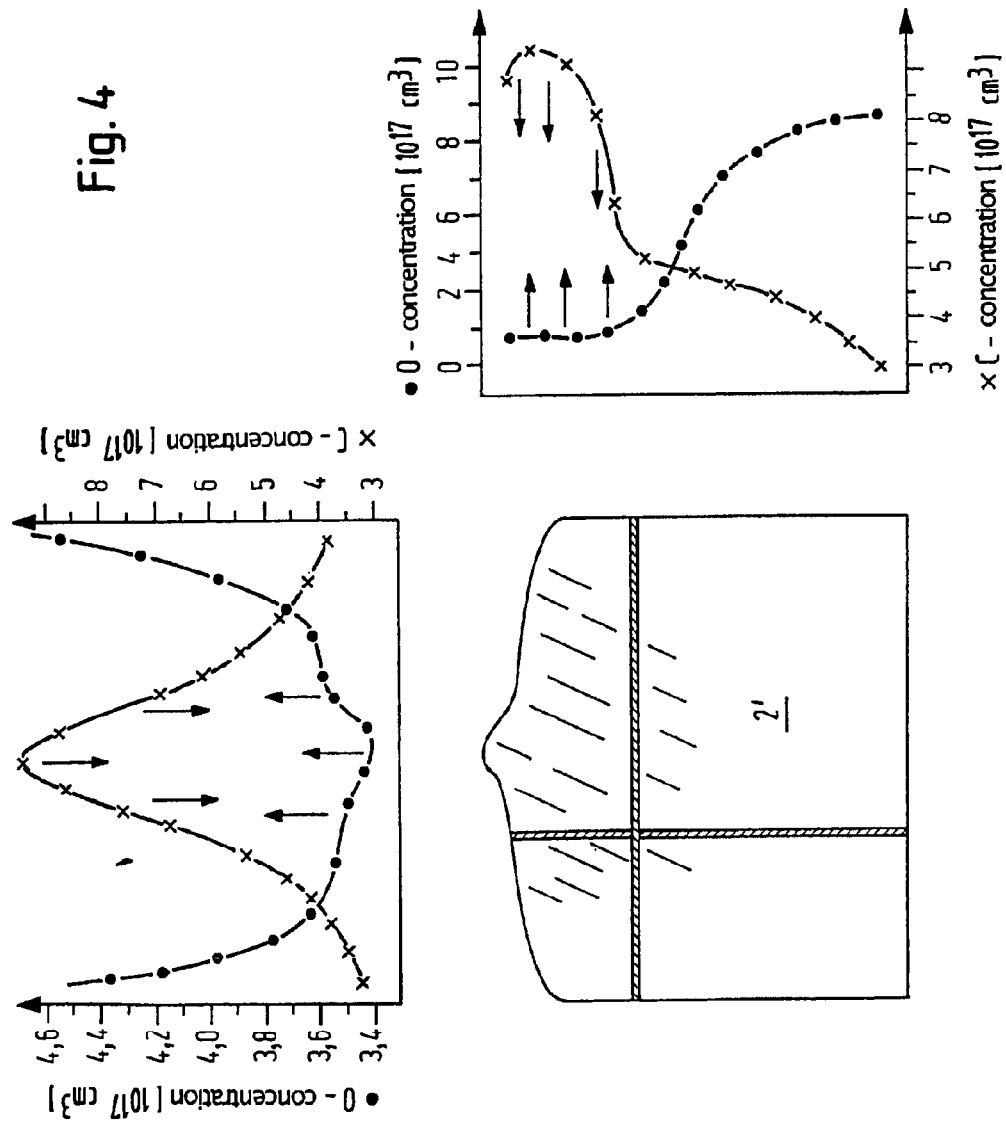

FIG. 3 shows a schematic illustration of still another apparatus or device for the production of poly- or multi-crystalline silicon by directed solidification according to still another embodiment of the present invention; and FIG. 4 shows a schematic scheme and charts with respect to a relationship between the oxygen concentration and the carbon concentration within an ingot made of solidified crystalline silicon, and how this relationship is controllable according to the present invention.

Figure 1:
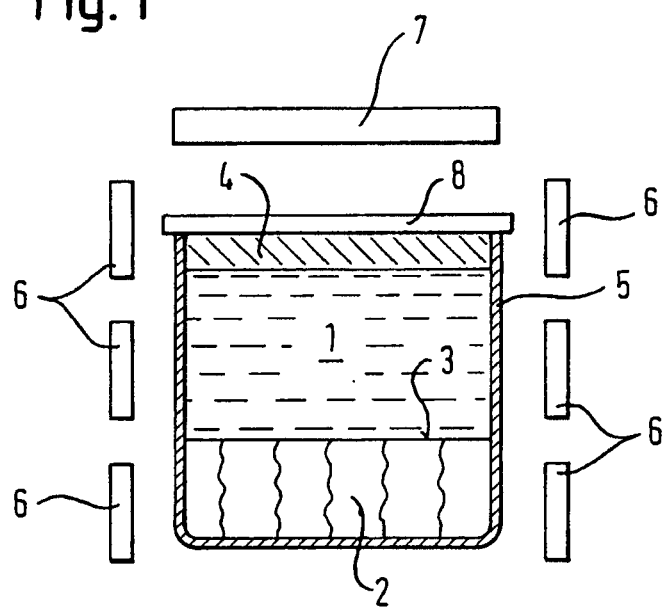
FIG. 1 shows a schematic illustration of an apparatus or device for the production of poly- or multi-crystalline silicon by directed solidification according to an embodiment of the present invention.
Figure 2:
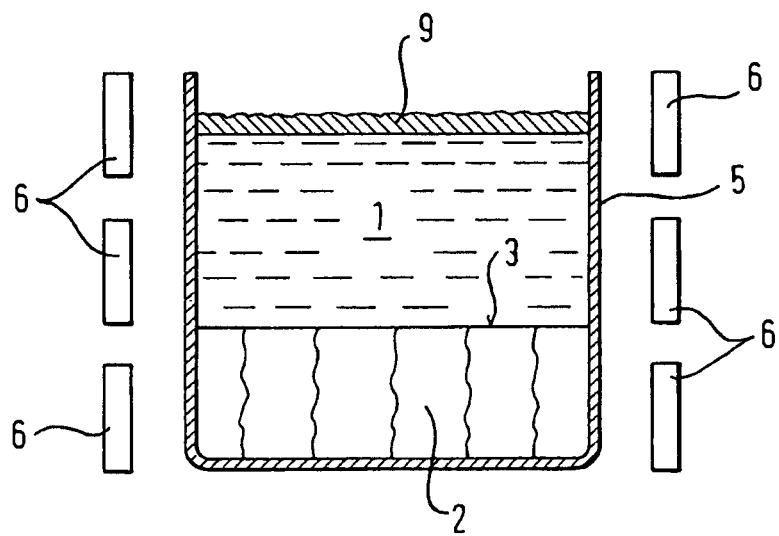
FIG. 2 shows a schematic illustration of a further apparatus or device for the production of poly- or multi-crystalline silicon by directed solidification according to another embodiment of the present invention.

In FIGS. 1, 2 and 3, alternative embodiments and modifications of an apparatus or device for producing poly- or multi-crystalline silicon based on the principle of solidification are shown, wherein the same reference signs denote corresponding components of the device, and those having an apostrophe respectively denote modifications. A silicon starting material is placed in a crucible 5. The silicon starting material may be undoped or, if desired, may contain a suitable dopant and correspondingly be, for example, p-doped or n-doped by respectively suitable dopants such as, e.g., boron, phosphorous or the like. A suitable material for crucible 5 is quartz ($SiO_2$) or graphite, which may optionally be coated by a chemically and thermally stable material. By performing out heating-up and melting periods of sufficient length, the silicon starting material is transferred into a silicon melt 1. Then, as shown in FIGS. 1 and 2, a multiple zone heater 6 circumferentially surrounding the crucible serves here as a heater to impress a temperature gradient such, that solidification is caused from the bottom up for forming multi-crystalline silicon 2. In the modified embodiment shown in FIG. 3, a locally fixed heater 6' is provided, and a temperature gradient is generated by moving down the crucible to a desired extend where the crucible is not surrounded by the fixed heater elements. In FIG. 3, a casing 10 for the furnace is schematically shown for illustration purposes, too.

Reference sign 3 in FIGS. 1 to 3 represents the phase boundary interface between the liquid or fluid Si-melt 1 and the solid multi-crystalline Si 2. According to the embodiment shown in FIG. 1, by applying a cover/plate/lid 8, a limited gas space 4 is created (indicated by a hatched region) which is totally separated to the outside, whereby thermo-chemical processes are allowed to be controlled in the gas phase above the melt. Partial pressures of relevant gaseous components are adjusted as well. In addition to the cover/plate/lid 8, or replacing it, there can be provided further means for controlling and/or maintaining a defined partial pressure of oxygen-, carbon- and/or nitrogen-containing gaseous components in the gas phase above the melt, such that a formation of precipitations or inclusions of SiC and/or $Si_xN_y$ (e.g. $Si_3N_4$) in the Si-melt and in the Si-crystal 2 can be prevented further. For example, there may be provided corresponding gas sources, delivery pipes and control valves for being delivered to, or removed from the gas space 4 for optionally further controlling partial pressures of oxygen-, carbon- and/or nitrogen-containing gaseous species, respectively alone or in combination.

The cover plate or lid 8 may be formed of temperature-resistant material, for example ceramics or graphite being optionally coated by a suitable chemically and thermally stable material. A cover heater 7 is provided above the cover/plate/lid 8, to further contribute to heating the cover/plate/lid 8, and thus to surely avoid condensation of gaseous components such as $SiO_x$ (e.g. SiO), thereby favourably influencing thermo-chemical reactions.

In accordance with the modified embodiment according to FIG. 2, instead of providing a cover/plate/lid 8 and optionally instead of cover heater 7, a cover material 9 is formed above the Si-melt in the form of a particulate or molten material, thereby further separating the Si-melt present in the crucible to the outside. Here, cover material 9 is formed, for example, of $SiO_2$-powder or -pieces. Alternatively or additionally thereto, other cover materials may be used, e.g. those which may serve not only for covering but also for doping the solid silicon, such as for example boron oxide ($B_2O_3$) for the purpose of covering as well s boron doping.

In accord with the modified embodiment according to FIG. 3, the provision of a plate 8' (which is modified in its form compared to the plate shown in FIG. 1) and the coverage of the melt by cover material 9 are combined.

FIG. 4 represents a schematic scheme and includes graphs, showing a relationship between oxygen concentration and carbon concentration in the ingot formed of the solidified crystalline silicon. For explanation purposes, a comparison ingot 2' is shown here from the bottom to the tapered head portion. Referring to this comparison ingot 2' of multi-crystalline silicon, i.e. a sample not corresponding to the present invention, the upper graph (right-handed beside ingot 2') indicates the respective distributions of oxygen and carbon concentrations in a sectional plane extending from the bottom to the top of crystal 2' (indicated by a correspondingly hatched bottom/top-layer in ingot 2'), whereas the left-sided graph (above the ingot tip) indicates the respective distributions of oxygen and carbon concentrations in a cross-sectional plane extending between the left-hand and right-hand sides of crystal 2'. Without observing the measures and conditions described above according to the present invention, sections indicated by hatching appears in the comparison-crystal 2', which sections are particularly critical for the formation of precipitates or inclusions of foreign matter. These critical sections inevitably occur, because—by reference to a prescribed system and without observing proper conditions—the concentration of foreign atoms selected from oxygen, carbon and nitrogen (especially oxygen and/or carbon) in the silicon melt and thus in the solidified poly- or multi-crystalline silicon cannot be controlled in an aimed manner. As a consequence, sections are generated in the comparative ingot 2', in which the anti-correlated relationship of oxygen-to-carbon concentration, or oxygen-to-nitrogen concentration, is deleterious in terms of conditions favouring the formation of precipitations or inclusions.

On the other hand, the ratio of oxygen-to-carbon concentration, and/or the ratio of oxygen-to-nitrogen concentration in the silicon melt and thus in the silicon crystal undergoing solidification, is favourably influenced as indicated by the arrows shown in the graphs, such that the oxygen concentration raises and the carbon concentration (or, analogously, the nitrogen concentration) decreases relative to the comparison in the critical section. Hence, the critical section (indicated by hatching the comparison crystal 2' in FIG. 4) can be effectively prevented in the Si-crystal according to the present invention.

Compared with the embodiments shown and described in detail above, other alternative or modified embodiments can be applied. For example, alternative to, or in addition to covering the Si-melt, the respective partial pressure of gaseous species comprising oxygen (including oxygen-containing gases), carbon (including especially carbon oxide gases) and nitrogen (including especially nitrogen oxide gases), in particular the partial pressures of oxygen and carbon (including especially carbon oxide gases) can be adjusted and suitably controlled by corresponding gas sources and gas pipes delivered into the gas space 4, in order to further inhibit or prevent formation of compound precipitations or inclusions. Furthermore, the system may be designed such that silicon generally suitable for photovoltaics or solar cells (so-called "Solar Grade Silicon") can be produced. Thus, instead of poly- or multi-crystalline silicon, mono-crystalline silicon or another form of crystalline silicon can be obtained, as long as it is obtainable through directed solidification.

In the embodiments shown, a Vertical Gradient Freeze (VGF)—process was applied. However, the directive solidification can be carried out according to another process principle, e.g. a Bridgman Solidification (BS), a Heat Exchange Method (HEM), or similar processes. Further possibilities of directed. solidifications are, for example, a casting technology and especially Electromagnetic Casting (EMC). In the techniques based on the procedural principle of a directed solidification, it is possible that either the crucible or the furnace is moved, and/or that the temperature field is moved.

Many further modifications and combinations of embodiments can be contemplated based on the concept of the present invention as described above, without departing from the invention.

The invention claimed is:

1. Process for producing crystalline silicon, comprising the steps of:
    forming a melt of a silicon starting material,
    performing directed solidification of the silicon melt, wherein at least one of the following steps is performed
        a) a phase of a material in gaseous, fluid or solid form is provided above the melt such that a concentration of a foreign atom selected from the group consisting of oxygen, carbon and nitrogen in the silicon melt is controlled and thus a concentration of any one of such foreign oxygen, carbon or nitrogen atoms in the solidified crystalline silicon is controlled; or
        b) a partial pressure of a gaseous component in a gas phase above the silicon melt is controlled, the gaseous component being selected from the group consisting of oxygen gas, carbon gas and nitrogen gas and gaseous species comprising at least one element selected from oxygen, carbon or nitrogen;
    wherein at least during the entirety of the period of solidification steady-state equilibrium is established above the melt.

2. Process according to claim 1, wherein the silicon melt is solidified in a covered crucible separated from the outside.

3. Process according to claim 1, wherein the melt formed from the silicon starting material is surrounded by hot walls such that condensation of oxygen-containing gaseous components in the gas phase above the silicon melt is reduced or prevented.

4. Process for producing crystalline silicon, comprising the steps of:
    forming a melt from a silicon starting material,
    performing directed solidification of the silicon melt, wherein either
        a) the silicon starting material is melted in a crucible under a condition, wherein a covering material laying above the silicon melt is provided, wherein the covering material is selected from the group consisting of oxides or carbonates of elements, selected from the main groups III and IV of the periodic table of the elements, and mixtures thereof; or
        b) wherein the crucible is provided in a manner, such that a limited gas space providing a controlled gas atmosphere separated to the outside is formed above the silicon melt;
    wherein at least during the entirety of the period of solidification steady-state equilibrium is established above the melt.

5. Process according to claim 4, wherein walls surrounding the gas space are heated for reducing or preventing condensation of components from the gas space.

6. Process according to claim 1, wherein a covering material is overlying the silicon melt in the form of a particulate or molten matter, which completely or partially covers the melt.

7. Process according to claim 4, wherein the covering material comprises silicon dioxide, germanium dioxide, aluminum oxide, boron oxide or a mixture of the mentioned oxides.

8. Process according to claim 7, wherein a covering material in the form of powder or pieces of $SiO_2$ or $B_2O_3$ is applied onto the silicon starting material.

9. Process according to claim 1, wherein all components of a crucible or a furnace surrounding the silicon melt, or communicating therewith, are brought to a temperature during at least the phase of solidifying the silicon, which temperature lies above the condensation temperature of silicon oxide.

10. Process according to claim 1, wherein the steady-state equilibrium above the melt is also established during the heating-up and/or the melting periods.

11. Process according to claim 1, wherein the directed solidification is carried out according to a process principle being selected from a Bridgman Solidification (BS), Vertical Gradient Freeze (VGF) or Heat Exchange Method (HEM).

12. Process according to claim 1, wherein an oxygen source is controlled or reduced, which oxygen source is derived from any one origin selected from residual moisture, oxide components of starting materials, and elements of the production device communicating via a gaseous phase with the silicon melt.

13. Process according to claim 12, wherein the oxygen source is derived from residual moisture and is reduced by using a silicon starting material whose water content had been reduced, or by evacuating residual moisture from the space surrounding the silicon melt, before solidification is carried out.

14. Process according to claim 1, wherein an ingot is produced, from which silicon wafers are separated or individualized.

15. A process for the manufacture of solar cells, comprising:
providing silicon wafers separated or individualized according to claim 14, and carrying out at least one further steps of:
formation any one of p/n-junctions, metal/isolator/semiconductor-junctions, metal/semiconductor-junctions; and
optionally incorporating a dopant into the silicon crystal.

16. Device for producing crystalline silicon, comprising:
a crucible, chargeable by a silicon starting material,
at least one heater for heating the crucible,
wherein the device is arranged such that
  a) a concentration of a foreign atom selected from oxygen, carbon and nitrogen within the silicon melt is controllable and thus a concentration of any one of such foreign oxygen, carbon or nitrogen atoms within the solidified crystalline silicon is controllable; or
  b) a partial pressure of a gaseous component in a gas phase arrangable above the silicon melt is controllable, the gaseous component being selected from the group consisting of oxygen gas, carbon gas and nitrogen gas and gaseous species containing at least one element selected from oxygen, carbon and nitrogen,
wherein the device is arranged so that, at least during the entirety of the period of solidification, steady-state equilibrium is established above the melt.

17. Device according to claim 16, wherein the crucible is configured to be closed to establish a gas space above the melt being completely defined by hot walls.

18. Device according to claim 16, wherein the crucible is covered by a cover made of temperature-resistant material and separated from the outside.

19. Device according to claim 16, wherein the crucible containing the silicon starting material is provided such that a particulate or molten covering material is provided above the silicon starting material and above the silicon melt.

20. Device according to claim 19, wherein the covering material comprises a powder, particles or a melt of a material selected from the group consisting of $SiO_2$, $GeO_2$, $Al_2O_3$, $CaCO_3$ or $B_2O_3$ or mixtures thereof.

21. Ingot formed of crystalline silicon through directed solidification of a silicon starting material, wherein the ingot comprises no or essentially no foreign precipitations or inclusions of silicon carbide (SiC) or silicon nitride (SiN, Si3N4), wherein the oxygen concentration in at least 90% of the height of the whole ingot does not drop below a limit of about $3.5 \times 10^{17}$ cm$^{-3}$.

22. Ingot according to claim 21, wherein the oxygen concentration in at least 90% of the height of the whole ingot lies in a range of about $3.5 \times 10^{17}$ cm$^{-3}$ to about $1 \times 10^{19}$ cm$^{-3}$.

23. Ingot according to claim 21, wherein the oxygen concentration in at least 90% of the height of the whole ingot lies in a range of about $4 \times 10^{17}$ cm$^{-3}$ to about $1 \times 10^{18}$ cm$^{-3}$.

24. Ingot according to claim 21, wherein the carbon concentration in at least 90% of the height of the whole ingot lies below a limit of about $1 \times 10^{18}$ cm$^{-3}$.

25. Ingot according to claim 21, wherein the carbon concentration in at least 90% of the height of the whole ingot lies below a limit of about $6 \times 10^{17}$ cm$^{-3}$.

26. Ingot according to claim 21, wherein the silicon produced by directed solidification is p- or n-doped.

27. Silicon wafer formed of crystalline silicon, which is obtained by individualizing the ingot formed of crystalline silicon according to claim 21.

28. A solar cell comprising a silicon wafer according to claim 27.

* * * * *